United States Patent [19]

Kim et al.

[11] Patent Number: 4,954,456
[45] Date of Patent: Sep. 4, 1990

[54] FABRICATION METHOD FOR HIGH SPEED AND HIGH PACKING DENSITY SEMICONDUCTOR DEVICE (BICMOS)

[75] Inventors: Kwang S. Kim; Sang Hun Chai; Young S. Koo; Yeo H. Kim; Jin H. Lee, all of Chung Nam, Rep. of Korea

[73] Assignee: Electronics and Telecommunications Research Institute, Rep. of Korea

[21] Appl. No.: 224,020

[22] Filed: Jul. 25, 1988

[30] Foreign Application Priority Data

Jul. 25, 1987 [KR] Rep. of Korea ............... 87-8119

[51] Int. Cl.$^5$ ........................................... H01L 21/225
[52] U.S. Cl. ......................................... 437/31; 437/33; 437/59; 437/162; 148/DIG. 11; 357/43; 357/34; 357/59

[58] Field of Search ............ 437/31, 32, 33, 59, 437/162; 357/34, 43, 59 H; 148/DIG. 10, DIG. 11

[56] References Cited

U.S. PATENT DOCUMENTS 4,686,762 8/1987 Chai .................................... 437/162
4,784,971 11/1988 Chin ..................................... 437/33

Primary Examiner—Brian E. Hearn
Assistant Examiner—Kevin McAndrews
Attorney, Agent, or Firm—Saidman, Sterne, Kessler & Goldstein

[57] ABSTRACT

A fabrication method for a high speed and high packing density semiconductor device (BiCMOS) in which high speed polysilicon self-aligned bipolar transistors and high packing density CMOS are contained on the same wafer in such a manner that simplicity in fabrication is attained, while the high speed of operation and the high packing density of array are simultaneously realized.

3 Claims, 4 Drawing Sheets

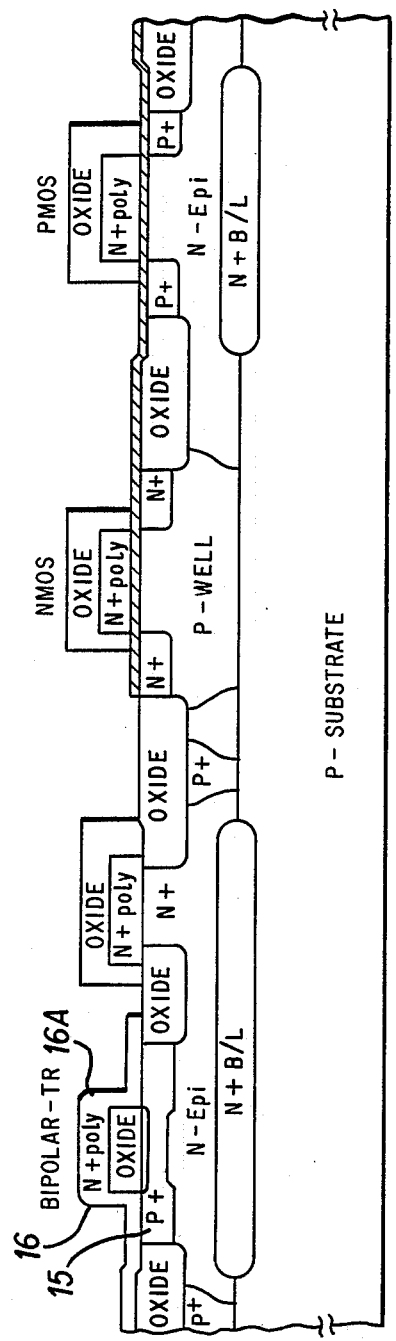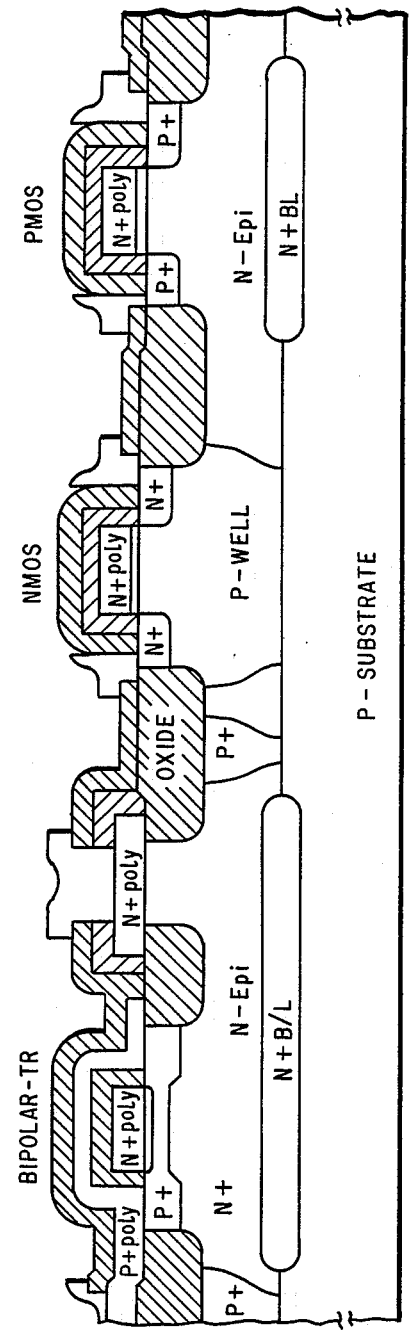

FABRICATION METHOD FOR HIGH SPEED AND HIGH PACKING DENSITY SEMICONDUCTOR DEVICE (BICMOS)

BACKGROUND OF THE INVENTION

1. Field of the Invention

The present invention relates to a fabrication method for a high speed and high packing density semiconductor device. More particularly, the invention relates to a fabrication method for a high speed and high packing density combined semiconductor device (BiCMOS) through the combination of bipolar and complementary metal oxide semiconductors (CMOS), the former being used in high speed circuits, and the latter being used in high packing density circuits.

2. Related Art

Generally, the important points which are taken into account in designing a large-scale integrated circuit are how to increase the operating speed, and how to limit heat radiation in the integrated circuit to a certain level even where the number of elements is greatly increased within the circuit.

In digital circuits, this factor may be expressed by the delay time multiplied by the power of the gate. The smaller this value is, the better the circuit is considered. Generally, bipolar circuits make it possible to lower the time delay in the gate, but their heat radiation is large. Therefore, the number of transistors which can be fabricated within one chip is limited. CMOS circuits make it possible to minimize the heat radiation through the circuit, thereby making them advantageous in terms of power consumption. But due to the limitation in the circuit driving capacity of CMOS transistors, they have the disadvantage that their operating speed is very slow.

And the recent trend in the design of integrated circuits is that the necessity for bipolar analog circuits as well as CMOS digital circuits is increased, because of the requirements for both analog and digital circuits in telecommunications devices.

Accordingly, the technology of combining bipolar devices and CMOS devices within one chip has been developed, and is being used in fields such as telecommunication ICs, and video tape recorder and camera ICs. Recently, the above technology has been applied in gate arrays and memory devices.

These devices are constituted in such a manner than CMOS is used where high packing density is required, while bipolar devices are used where high speed is required, thereby obtaining the functions of high speed, high packing density semiconductor devices.

Prior BiCMOS technology shown in FIG. 1 is fabricated in such a manner that bipolar devices are developed from CMOS devices, and the bipolar devices are fabricated on the basis of the CMOS process technology. Therefore, while the device fabrication for this method is in some ways simple, the high speed which is characteristic of bipolar devices is adversely affected.

In order to overcome this disadvantage, the technology of SBC (standard buried collector) is used as shown in FIG. 2. But in the bipolar devices fabricated by the SBC technology, P-N junction isolation is used for isolation of devices, and the existence of a lateral diffusion and depletion region hinders device area reduction. Furthermore, the resistance and the capacitance of respective devices cannot be further reduced, and therefore improvements in the operating speed of devices cannot be expected.

SUMMARY OF THE INVENTION

The present invention is intended to provide a fabrication method of high speed, high packing density devices, in which high speed polysilicon self-aligned bipolar transistors and high packing density CMOS are contained within the same wafer to overcome the above-described disadvantages of the prior art.

BRIEF DESCRIPTION OF THE DRAWINGS

The preferred embodiment of the present invention will be described in detail with reference to the attached drawings, in which:

FIGS. 3A–3E are cross-sectional views of the combined-type device, illustrating the fabrication steps according to the preferred embodiment of the present invention; and FIG. 4 is a cross-sectional view of the completed combined-type device according to the preferred embodiment of the present invention.

Like reference numerals refer to like elements throughout the drawings, including the following reference numerals useful in explaining the preferred embodiment:

Figure 1:
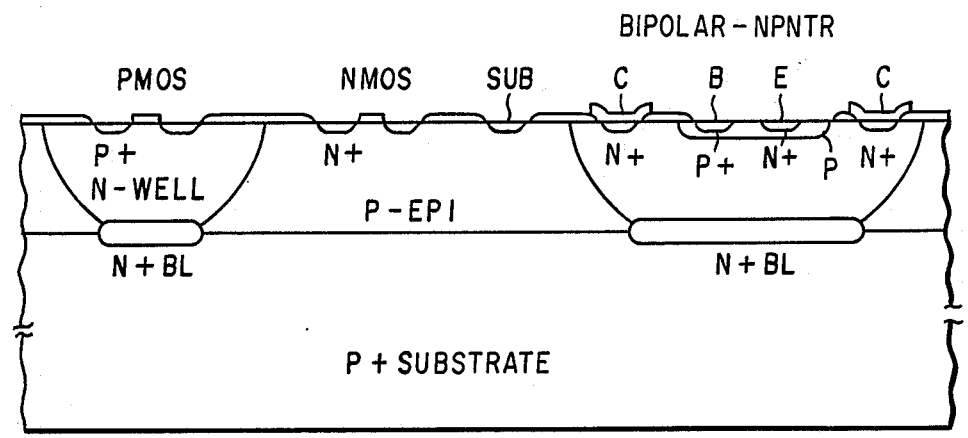
FIG. 1 is a cross-sectional view of a combined-type device of prior art fabrication, based on CMOS process technology.
Figure 2:
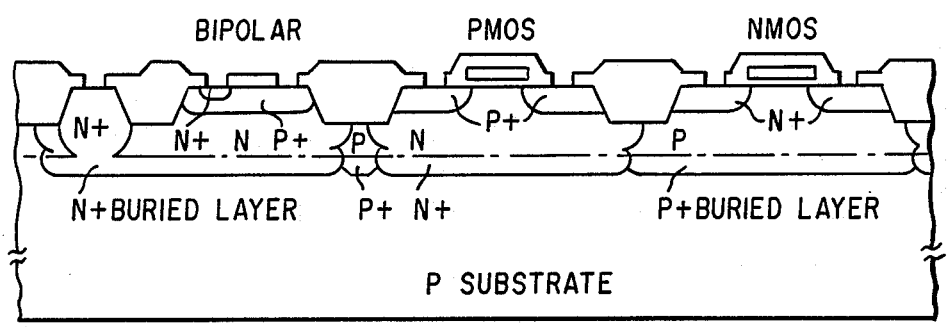
FIG. 2 is a cross-sectional view of a combined-type device fabrication formed using the bipolar process technology of the prior art.

1. N+ type buried layer
2. P-well
3. Device isolation region
4. P+ Junction isolation region
5. Gate oxide film
5A. Nitride film
6. Base of bipolar transistor
7. Collector of bipolar transistor
8. CMOS Gates
9. Emitter of bipolar transistor
10. Collector of bipolar transistor
11. Source/drain of PMOS devices
12. Source/drain of PMOS devices
13. Oxide film
14. Primary oxide film
14A. Vertical sidewall
14B. N+ polysilicon
14C. Horizontal side
15. Extrinsic base area
16. Base region of bipolar transistor
16A. P+ polysilicon

DETAILED DESCRIPTION OF THE PREFERRED EMBODIMENT

The preferred embodiment of the present invention is to provide a fabrication method for high speed and high packing density semiconductor devices, comprising the steps of:

forming an N+-type buried layer 1 upon a P-type substrate;

growing an N-epitaxial layer upon it;

depositing an oxide film and carrying out a masking process for defining a P-well;

implanting and diffusing an impurity down to the substrate in order to form a P-well 2;

removing oxide film on P-well and N-epitaxial layer;

growing an buffer oxide film and depositing a nitride film on the oxide film on the P-well and N-epitaxial layer;

growing an oxide film in order to complete a device isolation region 3, after the formation of a P+ junction isolation region 4;

growing a gate oxide film 5 of CMOS after removal of the buffer oxide film;

ion-implanting an impurity in order to form a base 6 and a collector 7 of bipolar transistors;

after removal of photoresist film, depositing polysilicon, and implanting an impurity in order to make polysilicon 14B an N+ type;

depositing an oxide film upon primary oxide film 14;

forming gates 8 of CMOS elements and emitters 9 and collectors 10 of bipolar transistors;

implanting an impurity in order to form source/drains 11 of PMOS devices;

implanting an impurity in order to form source/drains 12 of NMOS devices;

depositing an oxide film, and carrying out an etching so that an oxide film 13 should remain on the side wall 14A of the N+ type polysilicon;

depositing polysilicon upon oxide film 14;

doping an impurity by a thermal diffusion method or an ion-implantation method to make polysilicon 16A a P+ type;

carrying out a diffusion in order to form a P+ extrinsic base area 15;

removing photoresist film of the masking area so that the polysilicon should remain at the base region 16 of the bipolar transistor; and carrying out steps such as thermal diffusion for the source/drain and emitter of the CMOS devices, deposition of oxide film, oxide etching and deposition of aluminum.

Figure 3A:
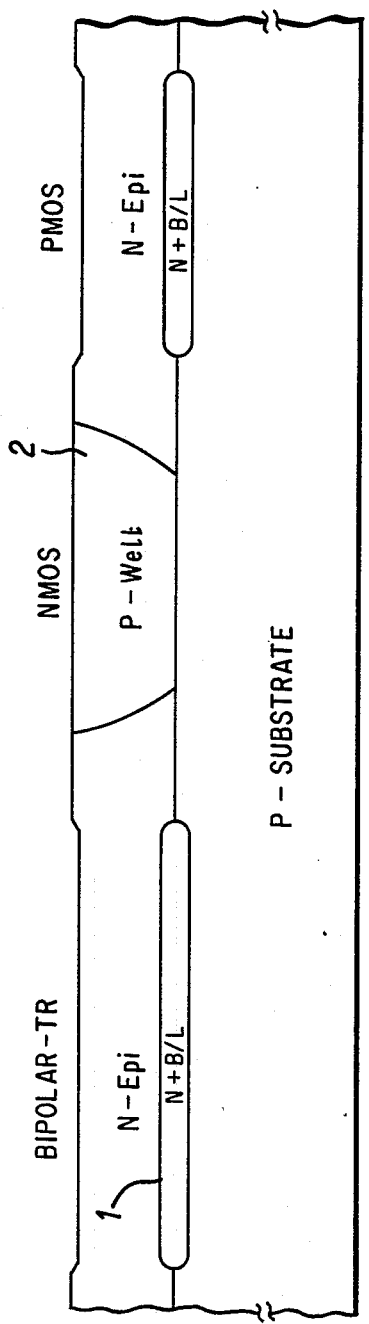

FIG. 3A shows a cross-sectional view in which the P-well is formed up for NMOS. A buried layer mask is used upon the surface a of P-type silicon wafer in order to establish the region for forming bipolar transistors and PMOS devices. Then by ion implantation with arsenic, n+ buried layer 1 is formed, and an epitaxial layer 1.5 to 2 $\mu$m thick doped with phosphorus is formed.

Due to the fact that the epitaxial layer is very thin, the collector resistance of the bipolar transistor is reduced. When the P-well for NMOS devices is being formed, the diffusion time is reduced, whereby the out-diffusion from the buried layer to the epitaxial layer being prevented.

After the step of oxide deposition and the masking for defining the P-well, boron ion is implanted, diffusion is carried out at a temperature of 1180° C. for 2 hours, and then the P-well 2 is diffused down to the P-substrate.

Figure 3B:
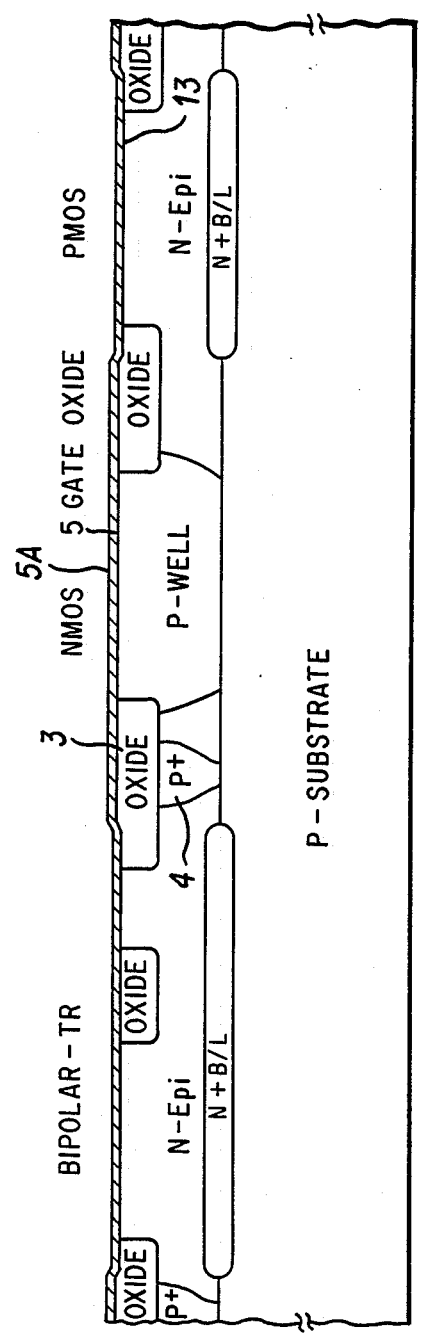

FIG. 3B shows the process sequence from the oxide isolation step to the forming of the gate oxide film. First, an oxide film 13 500 Å thick is formed, and then a nitride film 5A ($Si_3N_4$) 1500 Å is deposited by the low pressure chemical vapor deposition method. Then active regions for respective devices are defined by means of an active mask, and forming the isolation regions of devices 3 by means of the oxide isolation method. Before the growth of the oxide film, under the isolating oxide film for the isolation of the bipolar transistors, P-type junction isolation areas 4 are defined by means of a field mask and then, an impurity (such as boron) ion is implanted and diffused.

After removing of the nitride film 5A, the N area except the P-well 2 of NMOS is thinly ion-implanted with boron in order to control the threshold voltage of the PMOS devices, and the oxide film 13 is removed, as well as the gate oxide film 5 of CMOS is grown.

Figure 3C:
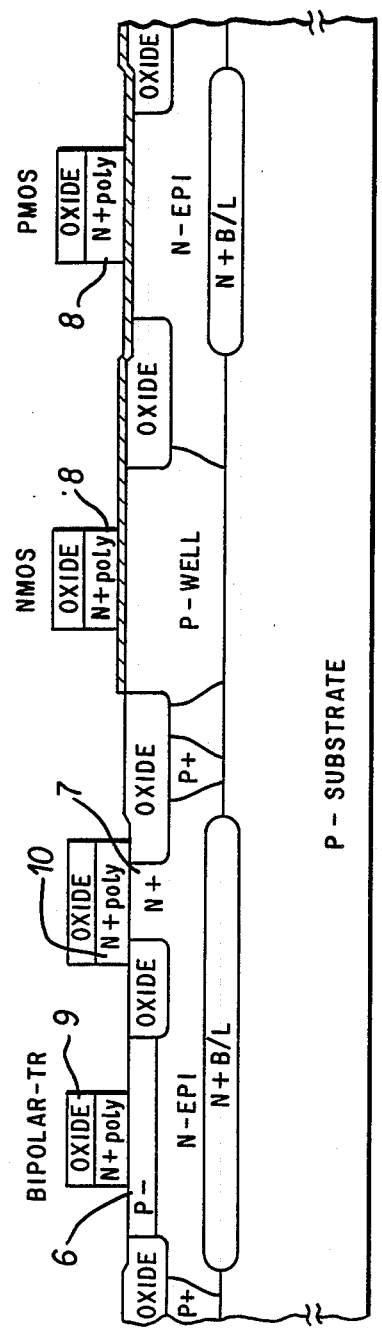

FIG. 3C shows the process of forming the emitter and collector of the bipolar transistors using polysilicon, and the gate of the CMOS. First, the base and the collector portion of the bipolar transistor are respectively defined by means of a mask. Then boron and phosphorous are respectively ion-implanted in order to complete the base 6 and the collector 7. After removal of the photoresist film, polysilicon is deposited up to the thickness of 3000 Å by means of low pressure chemical vapor deposition method (LPCVD), and then is ion-implanted with arsenic to form a N+-type polysilicon.

In order to isolate the N+-type polysilicon from the P+-type polysilicon which will be deposited for the extrinsic base area, an oxide film is deposited by means of the low-pressure vapor deposition method. Then gates 8 of the NMOS and PMOS devices, and emitters 9 and collectors 10 of the bipolar transistor are formed by means of the reactive ion etching method, and N+ polysilicon to P+ polysilicon separation is formed by means of the anisotropic etching of oxide film and polysilicon.

Figure 3D:
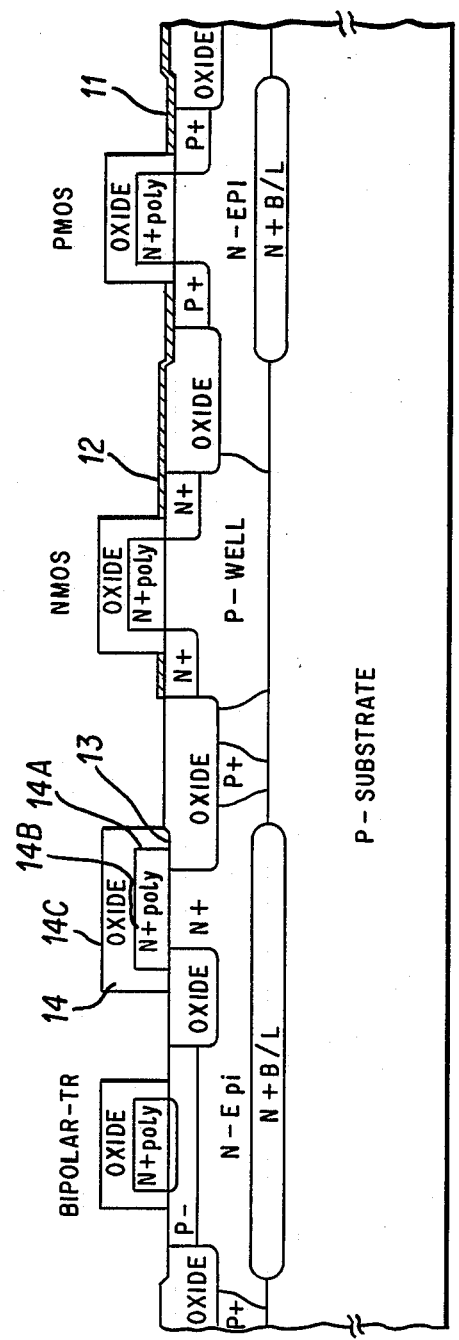

FIG. 3D shows the process of source/drain formation and electrically insulating the side wall 14A of the N+ polysilicon 14B which serve as emitter and collector. First, the P+ source/drain area 11 is defined, and boron (advantageously using $BF_2$ gas) is ion-implanted in order to form a source/drain of the PMOS devices. Meanwhile, in order to form a source/drain of the NMOS devices, the masking process for the N+ source/drain 12 is carried out, and then is ion-implanted with arsenic. Then an oxide film 14 3000 Å thick is deposited by means of the low pressure chemical vapor deposition method, and then the reactive ion etching with the anisotropic etching profile is carried out in order to etch away all the oxide film from all the horizontal sides 14C of the N+ type polysilicon including its upper side, except the vertical side wall 14A. However, through this process the oxide film 14 is protected due to the inherent characteristics of the etching process.

FIG. 3E shows the process of forming an extrinsic base area 15 in order to reduce the serial resistance of the bipolar transistor base 16. First, polysilicon is deposited up to the thickness of 3000 Å by means of the low pressure chemical vapor deposition, and then boron is doped into the polysilicon layer by means of the thermal diffusion method or ion-implantation method, in order to make it a P+-type. Then a diffusion process is carried out in order to form a P+ extrinsic base area 15 which has a low resistance, and then a reactive etching is carried out after the masking process of the P+ polysilicon, so that the P+ polysilicon 16A should remain only upon the base region 16 of the bipolar transistor.

Then after removal of the photoresist, the process steps for bipolar and CMOS devices (such as thermal diffusion for the source/drain of CMOS devices, and emitter of bipolar transistors deposition of oxide films, contact masking, oxide etching and aluminum sputtering, etc.) are carried out, a finished semiconductor (BiCMOS) device is formed as shown in FIG. 4.

If high speed, high packing density semiconductor devices are fabricated based on the processing of the present invention as described above, they can be advantageously used as custom and telecommunication ICs requiring high speed characteristics. Also, the fabrication method is convenient in producing large-scale integrated circuits which require high packing density.

What is claimed is:

1. In a fabrication method for high speed and high packing density semiconductor devices, the steps of:

forming an N+-type buried layer upon a P-type substrate;

growing an N-epitaxial layer upon it;

depositing an oxide film and carrying out a masking process for defining a P-well;

implanting and diffusing an impurity down to the N-epitaxial layer in order to form a P-well;

removing the oxide film on the P-well and N-epitaxial layer;

growing a buffer oxide film, and depositing a nitride film on the oxide film upon the P-well and N-epitaxial layer;

growing an oxide film in order to complete a device isolation region, after the formation of a P+ junction isolation region;

growing a gate oxide film of CMOS after removal of the buffer oxide film;

ion-implanting an impurity in order to form a base and a collector of bipolar transistors;

after removal of photoresist film, depositing polysilicon, and implanting an impurity in order to make the polysilicon an N+ type;

depositing an oxide film upon the N+ polysilicon;

forming gates of CMOS elements and emitters and collectors of bipolar transistors;

implanting an impurity in order to form source/drains of PMOS devices;

implanting an impurity in order to form source/drains of NMOS devices;

depositing an oxide film, and carrying out an etching so that an oxide film remains on a side wall of the N+ type polysilicon;

depositing polysilicon upon oxide film and doping an impurity by a thermal diffusion method or an ion-implantation method to make the polysilicon a P+ type;

carrying out a diffusion in order to form a P+ extrinsic base area; and removing photoresist film of the masking area so that the polysilicon remains at the base region of the bipolar transistor.

2. The fabrication method as claimed in claim 1, characterized in that the steps of forming the P+ junction-isolation region and the device isolation region is constituted such that, after definition of the active area for each device using an active mask, Boron ion implantation is used in order to form the P+ junction-isolation region, and then an oxide film 10000 Å thick is grown in order to complete the device isolation region.

3. The fabrication method as claimed in claim 1, characterized in that the step of depositing polysilicon upon oxide film is constituted such than an oxide film 3000 Å thick is deposited by means of low pressure vapor deposition method, a reactive ion etching is carried out so that the oxide film remains on the side surfaces of the N+ type silicon, and then polysilicon 3000 Å thick which will be used as P+ polysilicon is deposited by means of low pressure vapor deposition method on the oxide film.

* * * * *